United States Patent [19]
Deczky

[11] Patent Number: 5,757,683
[45] Date of Patent: May 26, 1998

[54] DIGITAL RECEIVE FILTER FOR COMMUNICATIONS SYSTEMS

[75] Inventor: Andrew G. Deczky, Ottawa, Canada

[73] Assignee: Northern Telecom Limited, Montreal, Canada

[21] Appl. No.: 655,400

[22] Filed: May 30, 1996

[51] Int. Cl.$^6$ .......................... G06F 17/10; G06F 17/17
[52] U.S. Cl. .................... 364/724.16; 364/724.1
[58] Field of Search .................. 364/724.16, 724.1, 364/724.17, 724.011

[56] References Cited

U.S. PATENT DOCUMENTS

| | | | |
|---|---|---|---|
| 3,798,560 | 3/1974 | Taylor | 364/724.2 |
| 4,393,272 | 7/1983 | Itakura et al. | 395/2.78 |
| 4,507,725 | 3/1985 | Christopher et al. | 364/724.03 |
| 4,829,378 | 5/1989 | LeGall | 358/160 |
| 4,918,524 | 4/1990 | Ansari et al. | 348/398 |
| 4,961,206 | 10/1990 | Tomlinson et al. | 375/261 |
| 4,972,357 | 11/1990 | Morel | 364/724.1 |
| 5,287,299 | 2/1994 | Lin | 364/759 |
| 5,297,069 | 3/1994 | Asato et al. | 364/724.16 |
| 5,500,811 | 3/1996 | Corry | 364/724.16 |

OTHER PUBLICATIONS

Jackson, et al; An Approach to the Implementation of Digital Filters; IEEE Transactions on Audio and Electroacoustics, vol. AU 16, No. 3; pp. 413–421, Sep. 1968.

"An Improved Search Algorithm for the Design of Multiplierless FIR Filters with Powers–of–Two Coefficients", H. Samueli, IEEE Transactions on Circuits and Systems, vol. 36, No. 7, pp. 1044–1047, Jul. 1989.

*Primary Examiner*—Paul P. Gordon
*Assistant Examiner*—Robert J. Dolan
*Attorney, Agent, or Firm*—R. John Haley

[57] ABSTRACT

A digital receive filter comprises first and second filter parts with a down sampler between them. Each filter part is formed by a plurality of cascaded filter stages each comprising a second order finite impulse response digital filter having symmetrical coefficients which in most cases are integer powers of two, and in other cases are zero or a sum of integer powers of two. The filter stages are implemented by delay units and add units with shifting of bits at the inputs of the add units to implement the coefficients, whereby multipliers are avoided. A described receive filter has two filter stages in the first part, a down sampling factor of two, and seven filter stages in the second part, with scaling factors and ordering of the filter stages to facilitate filtering and minimize noise.

18 Claims, 1 Drawing Sheet

DIGITAL RECEIVE FILTER FOR COMMUNICATIONS SYSTEMS

This invention relates to a filter for a communications system, and is particularly concerned with filtering at the receiver of the system by what is termed a receive filter.

BACKGROUND OF THE INVENTION

It is well known to communicate digital signals via a communications path using a transmitting modulator and a receiving demodulator which operate in accordance with a desired modulation scheme. By way of example, Tomlinson et al. U.S. Pat. No. 4,961,206 issued Oct. 2, 1990 and entitled "Data Modem System" describes a communications system using QPSK (Quadrature Phase Shift Keying) modulation with eight times oversampling of the binary signal to be communicated.

At the modulator or transmitter of such a system, the signal is digitally filtered in a transmit filter and modulated to form phase quadrature components which are converted by a digital-analog (D/A) converter to be applied to the communications path. The transmit filter is conveniently implemented by a look-up table in ROM (Read Only Memory), which can be arranged simultaneously to perform the modulation function in an eight times oversampled system. At the receiver or demodulator of the system, the received analog signal is converted to a digital signal by an analog-digital (A/D) converter and demodulated to produce received signal components which are digitally filtered by the receive filter and processed to recover the original signal. The receive filter can also be implemented by a look-up table in ROM.

As is well known, the transmit and receive filters are designed to provide a composite filter amplitude response which is flat in the pass band to minimize distortion, has a raised-cosine shape in the transition band (typically with 20 to 30% excess bandwidth) to minimize inter-symbol interference (ISI), and has a large attenuation in the stop band to minimize adjacent channel interference (ACI). As described in the Tomlinson et al. patent, the desired spectral shaping is divided equally between the transmit and receive filters for optimum system performance.

A problem with such a system is that, whereas for each of the quadrature phases the transmit filter is supplied with a single bit of the binary signal per modulation symbol, the receive filter is supplied with a multiple-bit output from the A/D converter; for example this may comprise 6 bits, as described in the Tomlinson et al. patent, or 8 bits per symbol. Consequently, the ROM constituting the receive filter must be a multiple of ($2^6$ or $2^8$ times) the size of the transmit filter ROM. For a high bit rate, for example 2.56 Mb/s, of the binary signal a desired performance may require a 63-tap FIR (finite impulse response) transmit filter. A similar receive filter for accommodating multiple bits per symbol becomes undesirable or impractical in terms of ROM size for a look-up table filter, speed for a DSP (digital signal processor) implementation of the filter, and/or costs.

An object of this invention is to provide a simplified digital filter for use as a receive filter in a communications system.

SUMMARY OF THE INVENTION

According to this invention there is provided a digital receive filter for a communications system, the filter comprising a first filter part for filtering samples at a first frequency, a down sampler for down sampling an output of the first filter part by an integer down sampling factor L, and a second filter part for filtering samples from an output of the down sampler at a second frequency equal to the first frequency divided by L, wherein at least the second filter part comprises a plurality of cascaded filter stages, each filter stage of the second filter part comprising a second order finite impulse response digital filter having symmetrical coefficients comprising a middle coefficient the magnitude of which is either zero, an integer power of two, or a sum of a plurality of integer powers of two, and two further coefficients the magnitude of each of which is an integer power of two.

The implementation of such a filter is facilitated by making the middle coefficient of each of a majority of the filter stages an integer power of two. Each of the majority of filter stages can then comprise a latch for latching an input sample, a first delay unit for delaying an output of the latch by one sample period, a first add unit for adding an output of the first delay unit and an output of the latch, a second delay unit for delaying an output of the first add unit by one sample period, and a second add unit for adding an output of the second delay unit and an output of the latch. Integer power of two coefficients are then effected by shifting of bits supplied to the inputs of the add units. The other filter stages can be similar except for omission or duplication of the first add unit. In this way, the filter stages are greatly simplified by not requiring any multiplier units.

The symmetrical coefficients of each filter stage are preferably products of a scaling factor A which is an integer power of two and normalized symmetrical coefficients 1 B 1 of the filter stage. The normalized middle coefficient B of one of the filter stages of the second part can be negative with a magnitude greater than 2, whereby this filter stage provides a gain which increases with increasing frequency to compensate for slope in the pass band of the other filter stages which have normalized middle coefficients B with magnitudes that are positive, zero, or less than two. This one of the filter stages is desirably positioned among the cascaded filter stages of the second filter part nearer to an output than to an input of the second filter part for optimum filtering of noise.

The first filter part preferably comprises a plurality of cascaded filter stages, each filter stage of the first filter part comprising a second order finite impulse response digital filter having symmetrical coefficients comprising a middle coefficient the magnitude of which is an integer power of two, and two further coefficients the magnitude of each of which is an integer power of two.

In an embodiment of the invention described below, the first filter part consists of two filter stages, L=2, and the second filter part consists of seven filter stages having normalized middle coefficients B of 2, 1, 0, −½, ½, −2¼, and 2.

BRIEF DESCRIPTION OF THE DRAWINGS

The invention will be further understood from the following description with reference to the accompanying drawings, in which.

DETAILED DESCRIPTION

Figure 1:
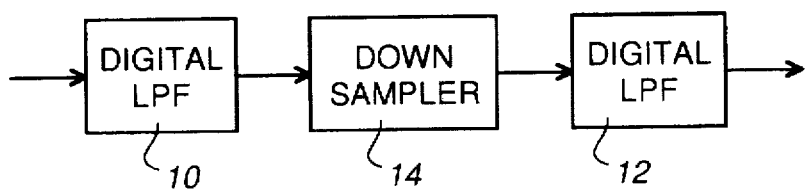
FIG. 1 schematically illustrates a block diagram of a two-part receive filter which uses cascaded filter stages in accordance with the invention.

The invention is described below by way of example in its application to a system in which a binary signal having a bit rate of 2.56 Mb/s is communicated, for example via a cable television distribution network, using DQPSK (differential QPSK) modulation at a symbol rate corresponding to a frequency of 10.24 MHz. In such a system, pairs of bits (dibits) of the binary signal are eight times oversampled and modulated as a differential phase of the two quadrature phase carriers at one quarter the sampling rate; this facilitates implementation of the modulator in that the interpolation, transmit filtering, and modulation functions can be constituted by using look-up tables in ROM. However, it should be appreciated that these details are given only by way of example and to facilitate understanding of the invention, and that the invention is also applicable to other systems, modulation schemes, and communication rates.

After D/A conversion in the transmitter, analog filtering at the transmitter and receiver for communication of the analog signal via the communications path, and A/D conversion in the receiver, harmonic images of the digital DQPSK spectrum exist at center frequencies of (2.56+5.12 m) MHz, where m is zero or a positive or negative integer. Using the sampling rate of 10.24 MHz facilitates demodulation, which results in desired signal components at center frequencies of 0 and 10.24 MHz and an undesired harmonic image at a center frequency of 5.12 MHz after quadrature mixing. The receive filter is desired to perform digital low pass filtering to remove this harmonic image and ACI. For 30% excess bandwidth this requires a stop band cut-off frequency of the filter of 1.3×1.28/2=0.832 MHz and suppression, i.e. high attenuation, of the harmonic image at 5.12 MHz.

A high-order filter is required to meet these requirements directly. In addition, as explained in the introduction, it is conventional to divide the system filtering requirements equally between the transmit and receive filters. As a result of these considerations and the fact that the receive filter operates on the multiple-digit output of the A/D conversion process, the receive filter becomes very complex.

This disadvantage is avoided in the embodiment of the invention described below in the following ways. Firstly, the required order of the filter is lowered to a large extent, while achieving the same filtering results, by using multi-rate signal processing techniques in which the filter is divided into different filter parts. Secondly, these filter parts are designed to be implemented using simple filter stages in cascade. These steps result in a receive filter that has approximately, but not exactly, the desired response for an equal division of filtering between the transmit and receive filters. The transmit filter is then designed to match the receive filter, i.e. to provide, in cascade with the actual response of the receive filter, the particular desired combined filter response for the system.

More particularly, the use of multi-rate signal processing techniques divides the filter into two parts with decimation, or down sampling, between the successive parts. The first part of the filter operates at the sampling frequency of 10.24 MHz, and the second part operates on the decimated sequence at a frequency of 10.24 /L MHz where L is the decimation or down sampling factor. Although not further described here, the same techniques can be used to divide the filter into more than two parts, with down sampling between each pair of successive filter parts, the filter parts all operating at successive lower frequencies.

FIG. 1 illustrates a receive filter comprising two digital LPF (low pass filter) parts 10 and 12 arranged in this manner, with a down sampler 14 between the two parts. An objective is to distribute the filtering load between the LPF parts 10 and 12 so that filtering is computationally efficient.

In the embodiment of the invention described below, in order to perform as little processing as possible at the higher sampling rate of the LPF part 10, this is implemented as a relatively simple LPF in order to suppress the harmonic image at 5.12 MHz, and the LPF part 12 operating at a lower rate is implemented as the main filter for suppressing ACI. The down sampling factor L of the down sampler 14 is selected to be 2, so that the LPF part 12 operates at the same frequency, 5.12 MHz, as the removed harmonic image. The LPF part 10 is implemented as a 5-tap FIR filter, and the LPF part 12 is implemented as a 15-tap FIR filter, the two parts providing a composite frequency response equivalent to that of a 33-tap filter.

Figure 2:
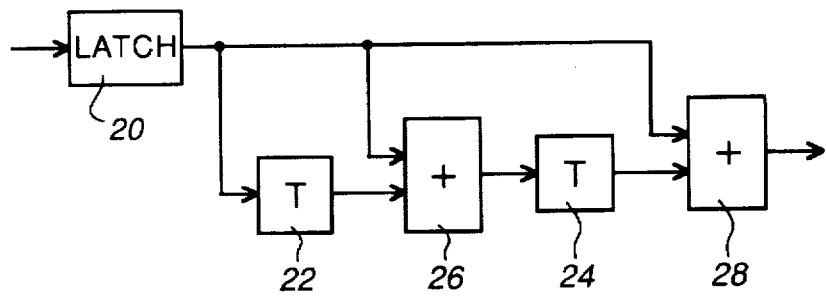
FIG. 2 schematically illustrates a basic form of a filter stage used in a receive filter in accordance with an embodiment of the invention.

Each of the LPF parts 10 and 12 is constituted by a plurality of cascaded second order FIR filter stages having symmetric coefficients; generally the stages each have a simple basic form and implementation as illustrated in FIG. 2.

Referring to FIG. 2, each filter stage comprises a latch 20, two delay units 22 and 24 each providing a delay of one sample time T at the operating frequency of the filter stage, and two add units 26 and 28. It can be appreciated that in a DSP implementation of the filter stage, these would all be constituted by functions of the DSP. The latch 20 serves for latching each input signal sample to the filter stage, and its output is coupled to an input of the delay unit 22 and a first input of each of the units 26 and 28. The unit 26 has a second input coupled to an output of the delay unit 22, and an output coupled to an input of the delay unit 24. The unit 28 has a second input coupled to an output of the delay unit 24, and an output constituting an output of the filter stage.

Each sample incoming to the filter stage is denoted $X(n)$, with the preceding two samples being denoted $X(n-1)$ and $X(n-2)$ respectively, where n represents a sample number and X represents the value of the sample, which comprises multiple, for example at least eight, digits. Generally, each coefficient of the filter stage is an integer power of two, and is accomplished by coupling the bits of the respective sample to the bit lines of the respective input of the unit 26 or 28 with an offset corresponding to the coefficient. Equivalently, and as would be the case for a DSP implementation, each coefficient is implemented by a left-shifting or right-shifting of the bits of the respective value. For example, a left-shift by one or two bit positions implements a coefficient of 2 or 4 respectively, a right-shift by one or two bit positions implements a coefficient of ½ or ¼ respectively, and no shift implements a coefficient of 1. In addition, negative coefficient values are produced by twos-complement coefficient values in known manner.

Consequently, each filter stage can be seen to have a function of the general form $$Y(n)=A(X(n)+B\ X(n-1)+X(n-2))$$

where $Y(n)$ represents the output of the filter stage; $A=2^s$, where $s=0,\pm 1,\pm 2 \ldots$, is a scaling (or gain) factor; and $B=\pm 2^k$, where $k=0,\pm 1,\pm 2 \ldots$, is a normalized middle coefficient of the filter stage, i.e. the value of the middle coefficient, of the term $X(n-1)$, when the other two coefficients, of the terms $X(n)$ and $X(n-2)$, are 1.

Exceptions to the above generality are described below. In one case, the middle coefficient is zero; in this case the unit 26 (or its DSP function) is omitted from the filter stage. In another case, the middle coefficient is not an integer power of two but is a sum of two different integer powers of two; in this case the unit 26 (or its DSP function) is duplicated in the filter stage. Obviously this principle could be extended to filter stages having middle coefficients which are sums of more than two different integer powers of two, with correspondingly more add units in the filter stage.

A filter stage as illustrated in FIG. 2 can, for example, have a scaling factor A=¼ (i.e. s=−2) and a normalized middle coefficient B=2 (i.e. k=1), so that its function is:

$$Y(n)=¼X(n)+½X(n-1)+¼X(n-2)$$

with symmetrical coefficients ¼ ½ ¼. This would be implemented in the filter stage by a coefficient of ½ (right-shift by one bit position) at the first input of the unit 26 from the latch 20; a coefficient of ¼ (right-shift by two bit positions) at the second input of the unit 26 from the delay unit 22 and at the first input of the unit 28 from the latch 20; and a coefficient of 1 (no shift) at the second input of the add unit 28 from the delay unit 24. The sum of the coefficients represents gain through the filter stage, and in this case is 1. In order to accommodate the shifting of the input signals at the inputs of the units 26 and 28 without introducing quantizing noise, these units must have a greater bit-capacity than the signal samples being filtered. For example, the units 26 and 28 can be 12-bit adders for 8-bit input signal samples to the filter.

Figure 3:
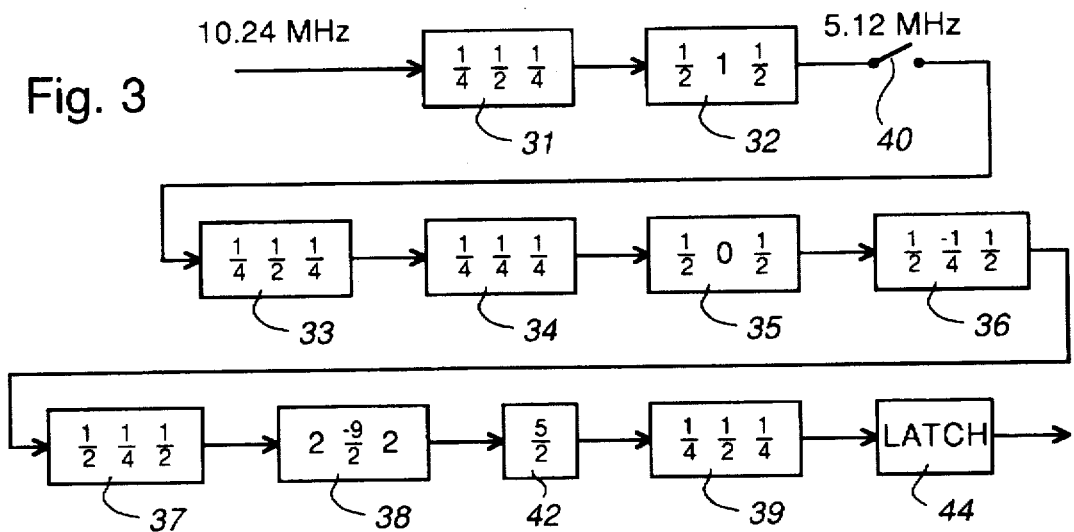
FIG. 3 schematically illustrates an arrangement of a receive filter as illustrated in FIG. 1 comprising cascaded filter stages as illustrated in FIG. 2 in accordance with an embodiment of the invention.

FIG. 3 illustrates a complete receive filter, comprising 9 filter stages 31 to 39 each of which is represented as a rectangle with the symmetrical coefficients of the filter stage being shown within the respective rectangle. The receive filter further comprises a sampling switch 40 which constitutes the down sampler 14 of FIG. 1, a gain stage 42 as described further below, and an output latch 44.

As described above, the LPF part 10 operates at the sampling rate of 10.24 MHz and is implemented as a relatively simple LPF in order to suppress the harmonic image at 5.12 MHz. It consists of the two cascaded filter stages 31 and 32 each as described above with reference to FIG. 2, the filter stage 31 having a scaling factor of A=¼ and the filter stage 32 having a scaling factor or gain of A=½. Both of the filter stages 31 and 32 have a normalized middle coefficient of B=2. The gains (sums of the coefficients) of the filter stages 31 and 32 are therefore 1 and 2 respectively, for a total gain of 2 through the filter part 10. This compensates for the fact that, as a result of demodulation in accordance with the modulation scheme described above, alternate samples of the respective one of the phase quadrature signals supplied to the filter are zero.

The signal samples are down sampled by the factor of L=2 by the switch 40 constituting the down sampler 14, so that the remainder of FIG. 3 operates at a sampling frequency of 5.12 MHz. This constitutes the LPF part 12 which comprises the 7 cascaded filter stages 33 to 39, with the additional gain stage 42 which provides a gain factor of 2½. The filter stages 33, 34, 36, 37, and 39 are each exactly as described above with reference to FIG. 2, with their respective scaling factors A and normalized middle coefficients B. The filter stage 35 differs from these stages in that its normalized middle coefficient B is zero, so that in this filter stage the function of the add unit 26 of FIG. 2 is dispensed with and the output of the delay unit 22 is connected directly to the input of the delay unit 24.

Figure 4:
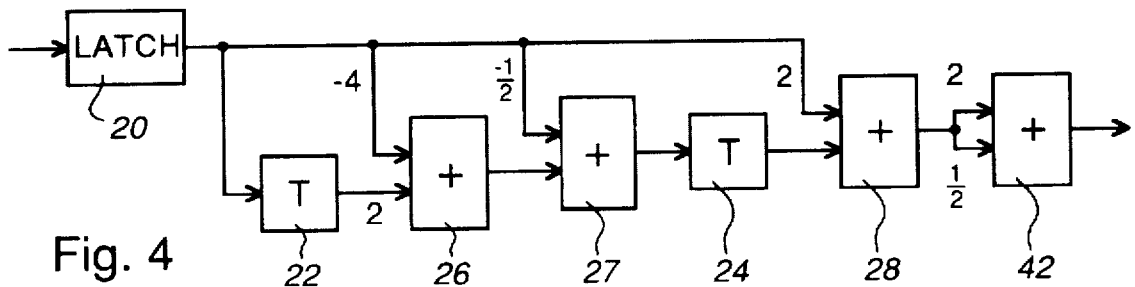
FIG. 4 schematically illustrates a modified form of the filter stage of FIG. 2 for use as one of the filter stages of the receive filter of FIG. 3.

The filter stage 38 also differs from the other stages in that it has a normalized middle coefficient of B=−2¼, the magnitude of which is not an integer power of two but is a sum of two integer powers of two (2 and ¼). Accordingly, in this filter stage 38 the add unit 26 of FIG. 2 is duplicated by an extra add unit 27 to provide this sum as illustrated in FIG. 4. FIG. 4 also illustrates an implementation of the gain stage 42, which is connected immediately following the filter stage 38, by a further add unit also referenced 42. Referring to FIG. 4. The filter stage 38 consists of the latch 20, delay units 22 and 24, and add units 26 and 28 as described above with reference to FIG. 2, with the extra add between the units 26 and 24 and having a first input coupled to the output of the latch 20, a second input coupled to the output of the add unit 26, and an output coupled to the input of the delay unit 24. The first and second inputs of the add unit 26 have weightings of −4 (twos-complement and left-shift two bit positions) and 2 (left-shift one bit position) respectively, as indicated by these numbers adjacent the input lines of this add unit. The first input of the add unit 27 has a weighting of −½ (twos-complement and right-shift one bit position) as indicated by this number adjacent its input line, and the second input has a weighting of 1 (no shift). The first input of the add unit 28 has a weighting of 2 (left-shift one bit position) as indicated by this number adjacent its input line, and the second input has a weighting of 1 (no shift). The add unit 42 has both its inputs coupled to the output of the add unit 28 of the filter stage 38 with weightings of 2 (left-shift one bit position) and ½ (right-shift one bit position) as indicated by these numbers adjacent its input lines, to provide the desired gain factor of 2½.

The scaling factors A, normalized middle coefficients B, symmetrical coefficients, and gains of the cascaded filter stages 31 to 39 and the gain stage 42 are summarized in following table:

| LPF Part | Stage | Scaling Factor A | Normalized Middle Coeff. B | Symmetrical Coefficients | | | Gain |
|---|---|---|---|---|---|---|---|
| 10 | 31 | ¼ | 2 | ¼ | ½ | ¼ | 1 |
|    | 32 | ½ | 2 | ½ | 1 | ½ | 2 |
| 12 | 33 | ¼ | 2 | ¼ | ½ | ¼ | 1 |
|    | 34 | ¼ | 1 | ¼ | ¼ | ¼ | ¾ |
|    | 35 | ½ | 0 | ½ | 0 | ½ | 1 |
|    | 36 | ½ | −½ | ½ | −¼ | ½ | ¾ |
|    | 37 | ½ | ½ | ½ | ¼ | ½ | 1¼ |
|    | 38 | 2 | −2¼ | 2 | −4½ | 2 | ½ |
|    | 42 | — | — | — | — | — | ½ |
|    | 39 | ¼ | 2 | ¼ | ½ | ¼ | 1 |

It can be seen from this table that the gain of the gain stage 42 is selected to make the total gain through the LPF part 12 also about 1 (actually 225/256). The order in which the filter stages (and gain stage) of each of the LPF parts 10 and 12 are cascaded is not significant to the filtering function itself. However, this order affects the sample magnitudes, and hence the required bit-capacity of the filter stages for reducing noise, so that the order illustrated in FIG. 3 and described above is preferred.

In the above respect it is observed that the filter stage 38 is optimally positioned towards the end of the cascaded filter stages of the LPF part 12 rather than towards the beginning. This is because the normalized middle coefficient B of the filter stage 38 has a magnitude greater than 2, as a result of which the gain of this filter stage increases with frequency so that it has a high gain for noise frequencies above its pass band. The other stages have normalized middle coefficient magnitudes less than 2, so that their gains for out-of-band noise are low. To avoid amplification of noise by the filter stage 38, it is therefore preferred that this noise first be attenuated by a majority of the other filter stages. The filter stage 38 correspondingly has a gain in the pass band that increases with frequency, so that it compensates for the pass band slope (decreasing gain with increasing frequency) of the other filter stages. The normalized middle coefficients B of these other filter stages determine the positions of nulls in the out-of-band frequency responses of the filter stages, and hence the response of the overall LPF part.

As explained above, the resulting receive filter is relatively very simple and can be designed to have a frequency response that is approximately, but not exactly, the desired response for an equal division of filtering between the transmit and receive filters. The transmit filter is then designed to provide a desired composite response, so that the convolution of the transmit filter with the receive filter produces an impulse response that is exactly zero at the Nyquist samples, which in the oversampling scheme described above is every eighth sample from the main pulse, to provide zero ISI. For example, for use in a system with the particular receive filter and modulation scheme described above, the transmit filter can be a 63-tap filter which can provide an acceptable performance without undue complexity.

Although the above description relates to a particular receive filter by way of example, it can be appreciated that the same principles can be applied to other filters. Thus the filter can if desired initially be divided into two or more parts with down sampling between the parts to minimize computation. For the filter or one or more filter parts, the normalized middle coefficients of a set of cascaded filter stages can be selected to provide nulls in the out-of-band frequency response at desired positions, and can be varied to optimize the filter for a desired frequency response. Scaling factors, optionally one or more gain stages, and the order of the cascaded filter stages can then be determined to minimize noise and the necessary bit-capacity of the filter stages.

Thus although a particular embodiment of the invention has been described in detail, it should be appreciated that numerous modifications, variations, and adaptations may be made without departing from the scope of the invention as defined in the claims.

What is claimed is:

1. A digital receive filter for a communications system, the filter comprising a first filter part for filtering samples at a first frequency, a down sampler for down sampling an output of the first filter part by an integer down sampling factor L, and a second filter part for filtering samples from an output of the down sampler at a second frequency equal to the first frequency divided by L, wherein at least the second filter part comprises a plurality of cascaded filter stages, each filter stage of the second filter part comprising a second order finite impulse response digital filter having symmetrical coefficients comprising a middle coefficient the magnitude of which is either zero, an integer power of two, or a sum of a plurality of integer powers of two, and two further coefficients the magnitude of each of which is an integer power of two.

2. A filter as claimed in claim 1 wherein the magnitude of the middle coefficient of each of a majority of the filter stages is an integer power of two.

3. A filter as claimed in claim 1 wherein each of the filter stages having a middle coefficient magnitude which is an integer power of two comprises a latch for latching an input sample, a first delay unit for delaying an output of the latch by one sample period, a first add unit for adding an output of the first delay unit and an output of the latch, a second delay unit for delaying an output of the first add unit by one sample period, and a second add unit for adding an output of the second delay unit and an output of the latch.

4. A filter as claimed in claim 1 wherein the symmetrical coefficients of each filter stage are products of a scaling factor A which is an integer power of two and normalized symmetrical coefficients 1 B 1 of the filter stage.

5. A second filter part as claimed in claim 4 wherein there are two filter stages each having a normalized middle coefficient B of 2.

6. A filter as claimed in claim 4 wherein there are seven filter stages of the second filter parts having normalized middle coefficients B of 2, 1, 0, –½, ½, –2¼, and 2.

7. A filter as claimed in claim 4 wherein the normalized middle coefficient B of one of the filter stages is negative with a magnitude greater than 2.

8. A filter as claimed in claim 7 wherein the normalized middle coefficient B of each of the plurality of filter stages other than said one of the filter stages has a magnitude that is positive, zero, or less than two.

9. A filter as claimed in claim 8 wherein said one of the filter stages is positioned among the cascaded second filter part stages nearer to an output than to an input of the filter.

10. A filter as claimed in claim 1 wherein the first filter part comprises a plurality of cascaded filter stages, each filter stage of the first filter part comprising a second order finite impulse response digital filter having symmetrical coefficients comprising a middle coefficient the magnitude of which is an integer power of two, and two further coefficients the magnitude of each of which is an integer power of two.

11. A filter as claimed in claim 10 wherein the magnitude of the middle coefficient of each of a majority of the filter stages of the second filter part is an integer power of two.

12. A filter as claimed in claim 10 wherein each of the filter stages having a middle coefficient magnitude which is an integer power of two comprises a latch for latching an input sample, a first delay unit for delaying an output of the latch by one sample period, a first add unit for adding an output of the first delay unit and an output of the latch, a second delay unit for delaying an output of the first add unit by one sample period, and a second add unit for adding an output of the second delay unit and an output of the latch.

13. A filter as claimed in claim 10 wherein the first filter part consists of two filter stages, and L=2.

14. A filter as claimed in claim 10 wherein the symmetrical coefficients of each filter stage of the second filter part are products of a scaling factor A which is an integer power of two and normalized symmetrical coefficients 1 B 1 of the filter stage.

15. A filter as claimed in claim 14 wherein the second filter part consists of seven filter stages having normalized middle coefficients B of 2, 1, 0, –½, ½, –2¼, and 2.

16. A filter as claimed in claim 14 wherein the normalized middle coefficient B of one of the filter stages of the second filter part is negative with a magnitude greater than 2.

17. A filter as claimed in claim 16 wherein the normalized middle coefficient B of each of the plurality of filter stages of the second filter part other than said one of the filter stages has a magnitude that is positive, zero, or less than two.

18. A filter as claimed in claim 17 wherein said one of the filter stages of the second filter part is positioned among the cascaded filter stages of the second filter part nearer to an output than to an input of the second filter part.

* * * * *

UNITED STATES PATENT AND TRADEMARK OFFICE
CERTIFICATE OF CORRECTION

PATENT NO : 5,757,683
DATED : May 26, 1998
INVENTOR(S) : Andrew G. Deczky

It is certified that error appears in the above-identified patent and that said Letters Patent is hereby corrected as shown below:

Column 6, line 35: insert --the-- before "following".

Claim 5 should read:

> 5. A filter as claimed in claim 4 wherein there are two filter stages of the second filter part each having a normalized middle coefficient B of 2.

Signed and Sealed this

Eighth Day of June, 1999

Attest:

Q. TODD DICKINSON

*Attesting Officer*   *Acting Commissioner of Patents and Trademarks*